SEMICONDUCTOR DEVICES AND METHOD OF MAKING SAME

Filed June 6, 1957

*INVENTORS*
ROBERT S. SCHWARTZ
BERNARD N. SLADE
*BY*
Alvin J. Riddles
AGENT

United States Patent Office 3,001,895
Patented Sept. 26, 1961

3,001,895

SEMICONDUCTOR DEVICES AND METHOD OF MAKING SAME

Robert S. Schwartz and Bernard N. Slade, Poughkeepsie, N.Y., assignors to International Business Machines Corporation, New York, N.Y., a corporation of New York Filed June 6, 1957, Ser. No. 664,069
5 Claims. (Cl. 148—1.5)

This invention relates to semiconductor devices and in particular to transistors employing a graded resistivity base region and an alloy type emitter region.

It has been established in the art that the presence of a variation in resistivity of the semiconductor material of which the base region of a transistor is fabricated, from a value that is low at the emitter to a higher value at the collector, will operate to provide an electric field in the base region of the transistor capable of reducing the transit time of the carriers responsible for transistor action. This electric field has been referred to in the art as a "drift field" and devices utilizing this "drift" field have given very high speed performance. In addition to the increase in performance realized in transistors by using an electric field to increase the rate of transit of the carriers, a further increase in speed of performance may be acquired by physically reducing the dimensions of the base region so that the carriers responsible for transistor action do not have as far to travel.

The combination of the above described "drift" field and a reduced physical size of the base region has resulted in transistors with very high speed performance. One such transistor and method of making same is described in U.S. Patent 2,810,870. As may be seen from the above described patent, many fabrication problems are encountered in the construction of transistors of this type.

What has been discovered is a semiconductor device construction capable of providing a high speed transistor having a graded resistivity base region and an alloy emitter wherein a number of the problems, which in the past have increased the difficulty of fabrication, have been minimized or avoided altogether by virtue of the technique of construction. Through this invention a high speed transistor is fabricated by providing an alloy region in a body of a particular conductivity type specific semiconductor material and in the alloy region a carrier metal is employed containing quantities of opposite conductivity type directing impurities, a first of which has a diffusion coefficient greater than the second and the second of which has a segregation coefficient greater than the first. The properties of the materials involved are so arranged that the conductivity type directing impurity with the higher diffusion coefficient, during the alloying operation, diffuses into the semiconductor body from the alloy front thereby converting the conductivity thereof, and the conductivity type directing impurity with the higher segregation coefficient provides a region of the original conductivity type of the body within the converted region when the alloy solidifies.

A primary object of this invention is to provide an improved method of making a high speed transistor.

Another object of this invention is to provide a method of forming two regions of alternately opposite conductivity on a semiconductor crystal where one region has a gradient of resistivity and both regions join at a PN junction, the injection efficiency and reverse breakdown voltage of which is precisely predictable.

Another object of this invention is a method of providing a diffused base, alloy emitter, semiconductor structure.

Still another object of this invention is to provide a method of making a "drift" transistor wherein close control of performance factors of the structure may be maintained as a result of the materials employed in the fabrication.

A related object is to provide a method of making a "drift" transistor wherein excessive temperature ranges are avoided.

Another related object is to provide a broad exposed area, graded base region, in a semiconductor structure.

Other objects of the invention will be pointed out in the following description and claims and illustrated in the accompanying drawings, which disclose, by way of example, the principle of the invention and the best mode, which has been contemplated, of applying that principle.

Figure 1:
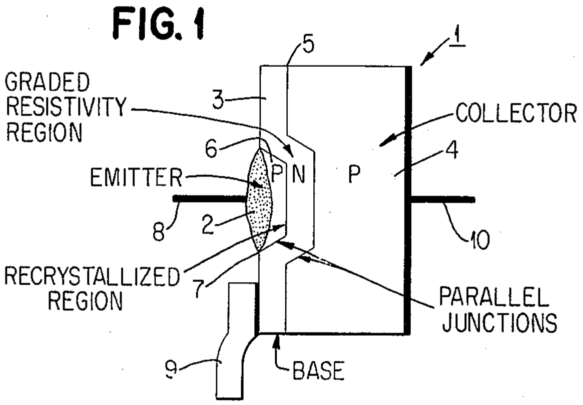
FIG. 1 is a view of a transistor illustrating this invention.

Referring now to FIG. 1, a transistor 1 is shown having emitter, base and collector regions labeled 2, 3 and 4, respectively. The transistor is illustrated as being made up of a semiconductor body containing a P type region 4 serving as the collector region and N type region 3, a broad area of which is exposed to the surface, and containing a gradient of resistivity which varies from a value which is low at the surface, to a higher value at the PN junction 5. The emitter region 2 comprises a recrystallized alloy zone 6 illustrated as P type material forming a PN junction 7 with the base region 3, an ohmic contact 8 is made to the recrystallized zone 6, an ohmic base contact 9 is shown attached to the base region 3 as by a soldering operation and an ohmic connection 10 is shown made to the P region 4.

Figure 2:
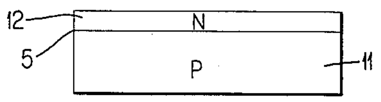
FIG. 2 is an illustration of a semiconductor crystal having an opposite conductivity type layer thereon.

The transistor of FIG. 1 is preferably made in the following manner. Referring now to FIG. 2, a quantity of semiconductor material, shown for illustration as a germanium die 11 of, in this example, P type conductivity is provided with a relatively thin surface region of opposite conductivity 12 shown for illustration as an N type. The N type resistivity surface covering is shown forming a PN junction which is later to become junction 5 of the transistor of FIG. 1.

One method of providing the surface area 12 which is later to become part of the base region 3, is the technique of vapor or solid state diffusion wherein an environment containing the appropriate conductivity type directing impurity is presented to the surface of the semiconductor die 11 in the presence of heat and the impurity is permitted to leave the environment and penetrate to a predetermined depth into the surface of the die 11 thereby changing the net concentration of one conductivity type impurity over the other conductivity type impurity so as to provide a change in the conductivity type of the material. The concentration of the conductivity type directing impurities in the N type region 12 as a result of a diffusion operation is an error function gradient from a value that is high at the surface to progressively lower values with depth into the material from the surface. The resistivity of the semiconductor material in region 12 will then vary from a value which is low at the surface to a higher value at the junction 5.

Figure 3:
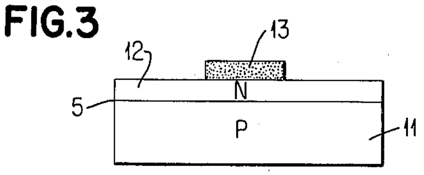
FIG. 3 is an example of an intermediate step in the process of manufacturing the transistor of FIG. 1 illustrating the application of a quantity of alloy material.

Referring now to FIG. 3, the germanium die of FIG. 2 is shown with a quantity of an alloy 13 placed in contact with the exposed surface of the region 12, later to become the base region of the transistor of FIG. 1. The alloy 13 is made up of at least a carrier material containing minor quantities of N and P type conductivity directing impurities. The carrier material is preferably a metal which forms an alloy with the semiconductor material at a temperature lower than the melting temperature of the semiconductor material, which is electrically inert in comparison to the conductivity type directing impurity material, which has low solubility with respect to the semiconductor material chosen for the die at temperatures in the range for reasonably rapid diffusion, which has a low vapor pressure at the diffusion temperature and which has a low diffusion coefficient with respect to the semiconductor material chosen for the die. The requirements of greater importance being the formation of a lower melting temperature alloy than the melting temperature of the semiconductor material and the relative electrical inertness. A primary advantage of the carrier material is to provide a greater depth of penetration in diffusion. This may be seen by referring to FIG. 1 wherein the region 3 may be relatively thick in a transistor thereby giving low base resistance and the carrier will provide sufficient greater penetration to the diffusion operation to cause the base to extend further into the crystal in the vicinity of the emitter region. From this it will be apparent that a thick base skin and associated low base resistance can be achieved in a device with a very thin base region. The carrier material contains small quantities of N type and P type conductivity directing impurities having a relationship in the alloying operation, such that the conductivity type impurity that is the same type as that of the conductivity type of the surface region 12 will have a diffusion coefficient considerably greater than that of the conductivity type directing impurity of the opposite type as that of the region 12 and that the segregation coefficient of the conductivity type directing impurity of the same type as original conductivity type of the region 11 will be considerably greater than that of the conductivity type directing impurity, that is, the same as that of the region 12. The alloy 13 meeting the above requirements will, when subjected to heat, extend the region 12 further into the body 10 and will form within such extension a region 6 of opposite conductivity type to the region 12.

In order to aid in understanding and comprehending the principle involved, consider as an illustration the alloy 13 to comprise 99.6% lead, 0.2% antimony and 0.2% gallium and the semiconductor body to be germanium. With this type of an alloy, the lead, acting as the carrier metal, forms an alloy with germanium at a temperature, that is, lower than the melting temperature of germanium, has low solubility in germanium at the high temperature required for diffusion of the antimony, has a very low vapor pressure and the lead is an electrically inert element with respect to germanium. The antimony has a much higher diffusion coefficient than the gallium and hence will diffuse much more rapidly into the germanium than the antimony. The diffusion coefficient of antimony is about one hundred times that of gallium. The diffusion or diffusivity coefficient is a measure of the ability of one material to penetrate into another. A discussion of the various aspects of diffusion appears in the following reference: "Diffusion In and Through Solids" by R. M. Barrer, Cambridge University Press. On the other hand, the segregation coefficient of gallium in a melt is much greater than that of antimony. The segregation coefficient is defined as ratio of concentration of a solute in the solid to its concentration in the liquid. Hence, when a melt of germanium, lead, antimony and gallium is cooled, the gallium segregates out more rapidly and controls the conductivity type of the region of the germanium that solidifies.

To illustrate this, referring now to FIG. 4, the die 11 with its opposite conductivity type surface 12 and the alloy 13 is placed under the influence of sufficient heat to provide diffusion with a reasonable length of time but below the melting point or a point which would cause thermal stress to the die 11.

For the particular example given above, approximately 800° centigrade is found to be adequate. At this temperature, the alloy 13 becomes molten and melts a portion of the germanium crystal forming an alloy pool containing germanium, lead, gallium and antimony. The antimony, having the higher diffusion coefficient diffuses into the P type semiconductor die from the molten pool in a sufficient quantity to predominate and to convert the conductivity type of the material to N type. Since an N type surface is already present, the N type region established in the die 11 is now electrically connected with the surface 12. As the environment and the sample is cooled, the molten material made up of the alloy of lead, germanium, gallium and antimony begins to solidify and for a distance the periodicity of the original crystalline structure of the die 11 is maintained, and, due to the selected higher segregation constant of the gallium, a predominance of gallium, or P type conductivity directing impurities, will be present in this recrystallized region labeled 6. This results in a structure whereby a thin, graded resistivity, N type, region 12A is formed, electrically connected to a N type region 12 already formed on the surface of the die 11 and a recrystallized type region 6 is fabricated forming a PN junction 7 with the N type regions 12 and 12A.

It will be apparent to one skilled in the art that since the injection efficiency ($\gamma$) and the reverse breakdown voltage of an emitter are determined by the ratio of resistivity on either side of an emitter junction, then since the N type region surrounding the emitter junction is formed, by diffusion from a molten pool which later formed the junction, a constant resistivity value over the entire surface of the junction on both sides will occur and therefore should this junction be used as an emitter, a constant injection efficiency ($\gamma$) over the entire surface thereof would be acquired. Similarly, through a choice of the magnitude of the segregation constant differential, the resistivity of the recrystallized P region may be controlled so that the ratio of resistivities across the junction 6 may likewise be controlled and the reverse breakdown voltage of the junction 7 may be selected.

Figure 4:
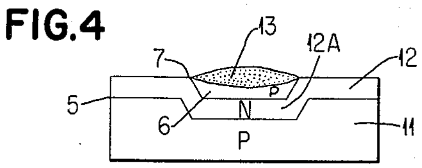
FIG. 4 is an illustration of another intermediate step in the process of manufacturing the transistor of FIG. 1, showing the formation of the emitter, base and collector regions.
Figure 5:
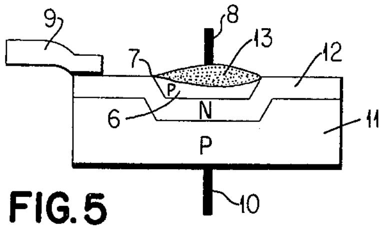
FIG. 5 is an illustration of the final step of fabrication of the transistor of FIG. 1 illustrating the application of ohmic contacts to the emitter, base and collector regions thereof.

Referring now to FIG. 5, the intermediate product of FIG. 4 may be converted to the transistor of FIG. 1 by the application of ohmic contacts to the emitter, base and collector regions. This is done in FIG. 5 by attaching an emitter connection 8 to the recrystallized zone formed from the alloy 13 so that it now becomes the emitter 2 of FIG. 1. Similarly, an ohmic base connection 9 is attached, such as by soldering to the exposed surface region 12 which then serves the function of the base region 3 of FIG. 1 and collector lead 10 may be applied such as by soldering to the surface of the P region 11 so that P region 11 now serves the function of the collector 4 of the transistor of FIG. 1. It should be noted that the carrier metal of the alloy 13 serves a convenient function at this step of the process in that it provides a large physical area ohmic contact to the recrystallized P region serving as the emitter of the device and similarly, the broad exposed surface area of the base region 3 greatly facilitates the application of a base contact thereto. The device of FIG. 5 may now be cleaned by appropriate techniques, standard in the art, such as electrolytic or chemical etching so as to remove contaminants on the surface of the device which tend to effect the reverse breakdown voltages of the junctions in the transistor.

Figure 6:
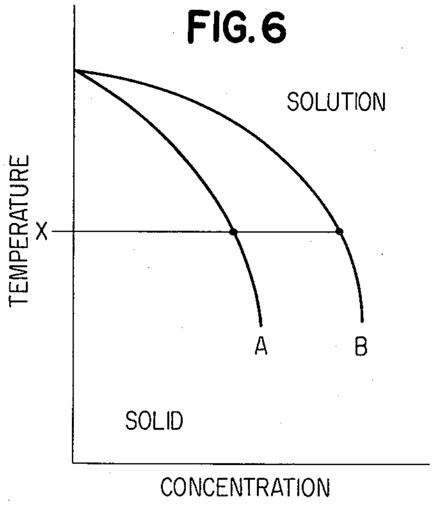
FIG. 6 is a graph illustrating a typical ratio of segregation with temperature for two constituents in a solution.

Referring now to FIG. 6, an illustrative graph is shown wherein a comparison is made of the segregation coefficient, in terms of quantity of solute and solution for the two conductivities as small quantities suspended in a carrier. The curves A and B represent the variation with temperature of two conductivity directing impurities suspended in the solution of the carrier used in the process. From this graph, it will be apparent that at an operating temperature, shown as X, a greater quantity of conductivity directing impurity A will be present in the solid phase than that of conductivity directing impurity B so that in order to control the conductivity type and the resistivity of the recrystallized region, it will be necessary in the alloy used in the process that the carrier material contain a quantity of conductivity directing impurity A having a higher segregation coefficient than that of conductivity directing impurity B and that conductivity directing impurity B have a higher diffusion coefficient than conductivity directing impurity A.

In order to aid in understanding and practicing the invention, the following information on specific value and materials is presented, it being understood that these specifications should not be construed as a limitation since it will be apparent to one skilled in the art that a wide range of materials with the desired physical properties may be used to meet the above described requirements of the process.

*Example A*

A P-N-P type structure as shown in FIG. 1 was formed using a cylinder .010 x .010 inch of lead 96.6%, gallium 0.2% and antimony 0.2% alloyed and diffused to a .0023 inch in thickness die of 2 ohm centimeter P type germanium by maintaining in a neutral environment at 800° centigrade for one hour. The surface of the die had been converted to N type conductivity by diffusion in an arsenic environment so that the surface was converted to a depth of 0.0005 inch. An ohmic base connection, circular in shape, having an aperture .045 inch in diameter, was soldered to the N type surface surrounding the alloyed region. This transistor was found to have a frequency cut off of 14 megacycles with a base to collector current amplification factor of approximately 500. The emitter reverse breakdown voltage was 2 volts and the "punch through" voltage was found to be greater than 45 volts.

*Example B*

An N-P-N transistor structure was formed by converting the surface to a depth of .0005 inch of an N type germanium crystal die .060 x .060 inch x .006 inch thick P type conductivity by diffusing indium into the surface of the N type crystal. An alloy cylinder .010 x .010 inch consisting of, as an inert carrier metal, tin 96.6%, as a P type impurity copper 0.2% and as an N type impurity antimony 0.2%; was heated at 700° C. in a neutral environment for one hour in contact with the crystal die. The diffusion coefficient of copper is approximately $10^{-5}$ square centimeters per second at this temperature and that of antimony is approximately $10^{-11}$ square centimeters per second. Under these conditions, the copper advanced into the die faster than the antimony by the ratio $10^{-5}/10^{-11}$. The segregation coefficient of antimony is .003 and that of copper is $10^{-5}$ so that as the die was cooled the recrystallized region became N type resulting in an N-P-N transistor structure. It will be apparent that the high diffusion coefficient of copper will permit the use of lower temperatures with a resulting reduction of thermal stress on the die.

In the above description and examples of the process of making this transistor, only the major steps in the process have been stressed and the fine points in the technology that result from the small sizes being handled and the etching solutions used, have been omitted since they are familiar to one skilled in the art. Moreover, it should be remembered that the degree of purity required in semiconductor device fabrication is greater than can be detected by spectroscopic means; for example, one impurity atom in ten million crystal atoms is sufficient to alter conductivity; and for this reason it is standard practice in the art to use extreme care in all stages of a semiconductor device fabrication process so that this degree of purity may be preserved.

In order to provide an understanding of the features useful in a good high speed transistor and the subtle manner in which the structure and method of this invention provides these advantages the following discussion is presented.

The transistor of FIG. 1 used as a device illustrating this invention, will have features as follows, a high base to collector current amplification factor (this is referred to in the art as $\alpha'$ or $\beta$), a very low "On resistance," a high avalanche or Zener and breakdown voltage, a very low storage time, a specific emitter to base breakdown voltage and a high "punch through" voltage.

In transistor construction, the high base to collector amplification factor is advantageous in order that a single transistor in a practical application may be capable of driving greater loads. The "On resistance" factor is a measure of the ohmic resistance internal to the collector stage of the transistor and this value causes a shift in level between the input and the output of the transistor. Each shift in level, though very small, causes a departure from reference in the output circuitry stage of the transistor and this departure may be a serious detriment in circuit design, in some cases, requiring level setting devices to return the signal to a proper reference. In addition to this, the "On resistance" is a direct factor in the amount of power dissipated, thus the greater the "On resistance" the more power that is dissipated within the semiconductor material. This dissipated power is transformed into heat and results in a change in ambient temperature which in turn may cause a variation in the performance parameters of the transistor. The avalanche or Zener breakdown of a transistor junction occurs when the carriers achieve sufficient velocity that the impact of a collision between each carrier and an atom in the crystal lattice transfers sufficient energy to drive an electron into the conduction band. The value of applied voltage at which this occurs is a function of the size of the region of the transistor influenced by the field associated with the junction. Avalanche or Zener breakdown permits the flow of excessive current and possible transistor damage. The storage time factor in a transistor is responsible for a time delay required for the signal level at the collector to return to a reference potential when a signal in the input returns to a reference potential. This time delay may be an appreciable part of the signal duration at high frequencies. It is caused by the presence of minority carriers in the base region of the transistor and is frequently referred to in the art as minority carrier storage. The effect of these carriers is, that as they arrive at the collector barrier, they reduce the back resistance of the collector barrier and permit a current to continue to flow in the collector circuit. This delay in recovery time may be as long as the carrier lifetime of the semiconductor material. This problem has been attacked in the art, for example, by the use of circuit techniques such as current overdriving and clamping and by transistor construction wherein the carrier lifetime of the base material is very short. Even this, when done to the limits of the semiconductor fabrication technology and circuit design has not been capable of providing a transistor component circuit with a cut-off collector current sufficiently short so that high frequency response in the megacycle range is possible. The specific emitter to base breakdown voltage is a clamp which permits the emitter junction of the transistor to be reverse biased only a certain amount in the cut-off condition and no further, so that an accurately predictable time is required to initiate conduction. The "punch through" voltage of a transistor is reached when the depletion layer associated with the reverse biased collector junction covers the entire base region and reaches the emitter. The penetration of the depletion layer into the base region is a function of the operating collector voltage and the base resistivity.

Each of the above factors introduces in to the design of circuits using transistors, serious limitations which because of their conflicting nature have not been avoidable; hence, have resulted in an upper limit of frequency response and current carrying capacity being placed on such circuits. The transistor of FIG. 1 embodies solutions to the above requirements into a single structure whereby a combination of types of elements and geometry provide many features, some of which in the past had to be gained through circuit design and others have not been available at all heretofore. This transistor has the following features provided in the following manner.

The graded resistivity base region 3 produces an electric field within the base region of the transistor 1 and the presence of this electric field adds a drift component to the diffusion component of motion of the carriers in the base region, so that injected minority carriers introduced at the emitter junction 7 can reach the collector barrier 5, more rapidly and the carriers that are stored in the base 3 when an input signal applied at the emitter 2 returns to the no signal level can more rapidly be swept out of the base region. The base region 3 is constructed to surround the emitter 2 to have a constant, closely controlled thickness dimension, a graded resistivity value and to be exposed on a broad surface area so as to facilitate the application of ohmic connections such as base contact 9. The transistor 1 is equipped with an alloy junction emitter 2 having essentially constant injection efficiency ($\gamma$) over the entire surface of the junction 7 and a specific and precisely controllable emitter to base breakdown voltage. The collector junction 5 has a cross sectional area equivalent to that of the base region 3.

These features cooperate to provide a superior transistor made in fewer steps than has been heretofore available in the art.

What has been described is a transistor structure and a technique of fabricating two regions of alternately opposite conductivity type on a semiconductor body wherein one of the two regions is provided with a gradient of resistivity and both regions join at a PN junction the injection efficiency and reverse breakdown voltage of which are precisely controllable. These regions then, in addition to the structure illustrated may be used in many of the various ways that are standard practice in the art, for example, in "PN hook" type collector structures and multiple input and output structures. In the case of the "PN hook" types of structures regions are often permitted to "float" electrically and no ohmic contact such as 9 in FIG. 1 is needed.

One of the more powerful advantages of this invention lies in the fact that the converted conductivity region 3 of the semiconductor body 1 of the device of FIG. 1 in the region adjacent to the junction 7 follows precisely the shape of the junction 7 since the diffusion proceeded therefrom. As a result of this, the base region 3 thickness of a transistor such as that of FIG. 1 in the emitter region will always be of uniform thickness and the emitter 7 and collector 5 junctions will be parallel.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. The process of making a transistor comprising, a first step of heating a semiconductor body of an original conductivity-type in contact with a material comprising a carrier, capable of forming an alloy with said semiconductor body at a temperature below the melting temperature of said body, and selected quantities of an original and an opposite conductivity-type directing impurity, said opposite conductivity-type directing impurity having a diffusion co-efficient greater than the diffusion co-efficient of said original conductivity-type directing impurity, said original conductivity-type directing impurity having a segregation co-efficient greater than the segregation co-efficient of said opposite conductivity-type directing impurity, said heating step being performed at a temperature above that at which said carrier is molten and below the melting temperature of said body, said quantities of said original and said opposite conductivity-type directing impurities being so selected and said heating step being continued at said temperature for such a time that only said opposite conductivity-type directing impurity diffuses significantly into said body to a predetermined depth thereby forming by said diffusion only a single region in said body, which region is of opposite conductivity-type to said body; and a second step of cooling said body thereby forming by segregation a re-crystallized region of said original conductivity-type in said body and applying an ohmic contact to each of said original conductivity-type portion of said body and said re-crystallized region.

2. The process of making a transistor comprising the steps of first, forming by diffusion a surface of opposite conductivity-type on an original conductivity-type semiconductor body; second, heating said body in contact with, on said surface, a quantity of material comprising a carrier, capable of forming an alloy with said body at a temperature less than the melting temperature of said body, and a quantity of an original conductivity-type directing impurity and a quantity of an opposite conductivity-type directing impurity, the diffusion co-efficient of said opposite conductivity-type directing impurity being greater than the diffusion co-efficient of said original conductivity-type directing impurity and the segregation co-efficient of said original conductivity-type directing impurity being greater than the segregation co-efficient of said opposite conductivity-type directing impurity, said heating step being carried out at a temperature greater than the melting temperature of said carrier and less than the melting temperature of said body whereby a molten alloy is formed on said body, said quantities of said original and said opposite conductivity-type directing impurities being so selected and said heating step being continued at said temperature for such a time that only said opposite conductivity-type directing impurity diffuses significantly from said molten alloy into said body so as to form by said diffusion only a single region in said body which region is of opposite conductivity-type to said body; and third, cooling said body forming thereby a re-crystallized region of said original conductivity-type and applying ohmic contacts to each of said original conductivity-type portion of said body, said opposite conductivity-type surface, and said re-crystallized region.

3. The process of making a transistor comprising the steps of first, forming by diffusion a zone of opposite conductivity-type in an original conductivity-type body; second, heating said body in contact with a quantity of material comprising a carrier, capable of forming an alloy with said body at a temperature less than the melting temperature of said body, and a quantity of an original conductivity-type directing impurity and a quantity of an opposite conductivity-type directing impurity, the diffusion co-efficient of said opposite conductivity-type directing impurity being greater than the diffusion co-efficient of said original conductivity-type directing impurity and the segregation co-efficient of said original conductivity-type directing impurity being greater than the segregation co-efficient of said opposite conductivity-type directing impurity, said heating step being carried out at a temperature greater than the melting temperaure of said carrier and less han the melting temperature of said body whereby a molten alloy is formed on said body, said quantities of said original and said opposite conductivity-type directing impurities being so selected and said heating step being continued at said temperature for such a time that only said opposite conductivity-type directing impurity diffuses significantly so as to produce by said diffusion only a single region in said body, which region is of opposite conductivity type to said body, thereby forming an extension of said opposite conductivity zone; third, cooling said body forming thereby a re-crystallized region of said original conductivity-type and applying ohmic contacts to each of said original conductivity-type portion of said body, said opposite conductivity-type zone, and said re-crystallized region.

4. The process of making a transistor as defined in claim 3 wherein said quantity of material comprises 96.6% lead, 0.2% gallium, and 0.2% antimony and wherein said body is P-conductivity-type germanium crystal, whereby a PNP structure is obtained.

5. The process of making a transistor as defined in claim 3 wherein said quantity of material comprises 96.6% tin, 0.2% copper and 0.2% antimony and wherein said body is an N-conductivity-type germanium crystal, whereby a NPN structure is obtained.

References Cited in the file of this patent

UNITED STATES PATENTS

| | | |
|---|---|---|
| 2,713,132 | Mathews et al. | July 12, 1955 |
| 2,725,315 | Fuller et al. | Nov. 29, 1955 |
| 2,764,642 | Schockley | Sept. 25, 1956 |
| 2,793,145 | Clarke | May 21, 1957 |
| 2,810,870 | Hunter et al. | Oct. 22, 1957 |
| 2,811,653 | Moore | Oct. 29, 1957 |
| 2,822,309 | Hall | Feb. 4, 1958 |
| 2,836,521 | Longini | May 27, 1958 |
| 2,840,497 | Longini | June 24, 1958 |
| 2,856,320 | Swanson | Oct. 14, 1958 |

FOREIGN PATENTS

| | | |
|---|---|---|
| 204,965 | Australia | Dec. 27, 1956 |

Notice of Adverse Decision in Interference

In Interference No. 96,230 involving Patent No. 3,001,895, R. S. Schwartz and B. N. Slade, SEMICONDUCTOR DEVICES AND METHOD OF MAKING SAME, final judgment adverse to the patentees was rendered Feb. 27, 1969, as to claims 1, 2 and 3.

[*Official Gazette September 2, 1969.*]